United States Patent
Shrivastava

(10) Patent No.: US 10,553,712 B2
(45) Date of Patent: Feb. 4, 2020

(54) HIGH-ELECTRON-MOBILITY TRANSISTOR (HEMT)

(71) Applicant: INDIAN INSTITUTE OF SCIENCE, Bangalore (IN)

(72) Inventor: Mayank Shrivastava, Bangalore (IN)

(73) Assignee: INDIAN INSTITUTE OF TECHNOLOGY, Bangalore (IN)

( * ) Notice: Subject to any disclaimer, the term of this patent is extended or adjusted under 35 U.S.C. 154(b) by 0 days.

(21) Appl. No.: 16/032,502

(22) Filed: Jul. 11, 2018

(65) Prior Publication Data

US 2019/0081164 A1 Mar. 14, 2019

(30) Foreign Application Priority Data

Jul. 12, 2017 (IN) ............... 20171024695

(51) Int. Cl.

| | |
|---|---|
| *H01L 29/739* | (2006.01) |
| *H01L 29/778* | (2006.01) |
| *H01L 21/768* | (2006.01) |
| *H01L 29/06* | (2006.01) |
| *H01L 23/31* | (2006.01) |
| *H01L 29/20* | (2006.01) |

(52) U.S. Cl.
CPC ...... *H01L 29/778* (2013.01); *H01L 21/76832* (2013.01); *H01L 23/3171* (2013.01); *H01L 29/0634* (2013.01); *H01L 29/2003* (2013.01)

(58) Field of Classification Search
CPC ............... H01L 29/063; H01L 29/0653; H01L 29/66341; H01L 29/77462; H01L 2924/13064; H01L 29/0634; H01L 29/0623; H01L 29/1058; H01L 29/66462; H01L 29/66893; H01L 29/7787

See application file for complete search history.

(56) References Cited

U.S. PATENT DOCUMENTS 8,759,879 B1 * 6/2014 Tipirneni .......... H01L 29/41766
257/190

* cited by examiner

*Primary Examiner* — Hsien Ming Lee

(57) ABSTRACT

The present disclosure provides a superjunction based design for normally-OFF HEMT that has two key components: (i) a recessed high-K metal gate and (ii) a superjunction layer under the gate, which is embedded within the N-type GaN buffer layers and separated from recessed gate. Recess gate is to deplete the 2 DEG from the channel region (under the gate) when the transistor is under OFF state. The present disclosure provides a new, improved, efficient and technically advanced HEMT device which can provide higher breakdown voltage, when compared to designs available in the prior-art, without affecting the performance figure of merits. Further, the new HEMT device offers improved breakdown voltage as compared to ON-resistance trade-off, improved the short channel effects, improved gate control over channel, improved switching speed for a given breakdown voltage, and improved device reliability. Furthermore, the new HEMT device lowers gate-to-drain (miller) capacitance and is available at low cost.

18 Claims, 13 Drawing Sheets

HIGH-ELECTRON-MOBILITY TRANSISTOR (HEMT)

TECHNICAL FIELD

The present disclosure relates generally to transistors. In particular the present disclosure relates to a high electron mobility transistor having an engineered buffer layer for reduced surface field (RESURF).

BACKGROUND

Background description includes information that may be useful in understanding the present invention. It is not an admission that any of the information provided herein is prior art or relevant to the presently claimed invention, or that any publication specifically or implicitly referenced is prior art.

Power electronics is an application of solid-state electronics for control and conversion of electric power. Power electronic products capture a big majority of electronics market share today, which is attributed to diverse range of applications they cater to, which in turn is enabled by advance power semiconductor device technologies. As well known in the art, semiconductor devices are electronic components that exploit electronic properties of semiconductor materials, principally silicon, germanium, and gallium arsenide, as well as organic semiconductors. Semiconductor devices have replaced thermionic devices (vacuum tubes) in most applications. They use electronic conduction in solid state as opposed to gaseous state or thermionic emission in a high vacuum. Semiconductor devices are manufactured both as single discrete devices and as integrated circuits (ICs), which consist of a few (as low as two) to billions of devices manufactured and interconnected on a single semiconductor substrate, or wafer.

Key semiconductor device technologies can be classified by their base materials such as Silicon (Si), Gallium arsenide (GaAs), Gallium Nitride (GaN), Silicon Carbide (SiC) and diamond. While Si, SiC and GaAs technologies are well established, GaN based devices and systems for high power and/or high frequency (RF) applications are currently entering the market. FIG. 1 illustrates an exemplary view of power electronics spectrum, its applications and exemplary trend of semiconductor device technologies used in these power electronics.

Growth and development of technology has consistently provided new and advanced types of semiconductor device technologies with wide range of technological applicability for the power electronics. One such semiconductor device technologies is a High-electron-mobility transistor (HEMT), also known as heterostructure FET (HFET) or modulation-doped FET (MODFET). The HEMT is a field-effect transistor incorporating a junction between two materials with different band gaps (i.e. a heterojunction) as the channel instead of a doped region (as is generally the case for MOSFET). A commonly used material combination is GaAs with Aluminium (Al) GaAs, though there is wide variation, dependent on the application of the device. Devices incorporating more indium generally show better high-frequency performance, while in recent years, gallium nitride HEMTs have attracted attention due to their high-power performance. Devices incorporating more indium generally show better high-frequency performance, while in recent years, gallium nitride (GaN) HEMTs have attracted attention due to their high-power performance.

It is expected that HEMT using GaN as its wide band gap semiconductor will be applied in diverse, power electronics/green ICT systems because of its high efficiency. GaN HEMT utilizes high-density two-dimensional electron gas (2DEG) accumulated in boundary layer between GaN and AlGaN through their piezoelectric effect and natural polarization effect, which makes it possible to realize a low on-state resistance ($R_{on}$). Combined with a high breakdown voltage, GaN HEMT indicates a superb performance as a power device. After the development of GaN HEMT technology for power amplifiers of mobile base stations, it was expanded to radar sensor applications. Further, expansion of its application is expected in the field of power conversion, i.e. in equipment such as server power systems. While the development of GaN HEMT technology has been promoted with focus on conventional "high output power", further advantages such as high efficiency and low energy consumption have been attracting much attention in recent years.

FIGS. 2-4 illustrate exemplary GaN HEMT devices that are available in prior-art, and which are currently being adopted by different manufacturers such as but not limited to, GaN System Inc, Engineered Plastic Components, Inc. (EPC), Transphorm, and the like. FIGS. 2A and 2B illustrate e-mode or normally-OFF GaN HEMT device with P—GaN (reverse polarization) layer in the gate stack (under gate electrode). Such layer keeps the channel depleted when gate to source voltage is below threshold voltage. However, when a sufficiently high gate voltage (higher than threshold voltage) is applied, device turns-on and offers switching operation. Though the design offers easy e-mode solution, it requires a P—GaN growth over standard AlGaN/GaN HEMT stack. Moreover, since the gate is 50-100 nm away from the 2DEG, the gate to channel control suffers in this architecture. Hence, this architecture is expected to suffer from slower turn-on and larger gate voltage swing for switching operation, which can also add to dynamic or turn-on losses. When gate-to-source voltage is below threshold, due to reverse polarization, channel is depleted from electrons. When the same exceeds threshold voltage, the channel inverts/accumulates electrons, which form a channel between accesses and drift regions. Such devices as illustrated in FIGS. 2A and 2B are mostly adopted by GaN Systems and EPC as known in the prior-art.

FIG. 3 illustrates another device available in the prior-art with a Si LDMOS in series (Cascode configuration) with normally-ON HEMT device. Source and Gate of Si LDMOS works as the source and gate of the combined switch, whereas drain of HEMT works as the drain terminal of this switch. Gate and source of HEMT and drain of Si-LDMOS are tied together, however are not available for contacting to outside world. Here HEMT device is to block higher voltages (increase breakdown voltage), whereas Si-LDMOS device is for normally-OFF operation. This design too offers an e-mode (normally-OFF) operation, however requires devices from two technologies, i.e. Si-LDMOS and GaN HEMT. Due to cascode operation, device performance is expected to be lower and limited to channel characteristics of Si-LDMOS device when compared to e-mode GaN HEMT. Last but not the least, this configuration is known to be less reliable both under extended stress as well as under short circuit stress conditions. Such devices are to increase breakdown voltage, whereas Si LDMOS device is for normally-OFF operation. Such devices as illustrated in FIG. 3 are mostly adopted by Transphorm.

FIG. 4 illustrates another device as disclosed in U.S. Pat. No. 7,449,762 B1, which has a recess and a P—GaN buffer layer. This forms RESURF junction with N—AlGaN layer.

Here recess gate is in direct contact with P—GaN layer. However, such device includes certain technical drawbacks and hence may not technically fit to provide desired functionalities. One of the major technical problems available in the device of U.S. Pat. No. 7,449,762 B1 is attributed to gate stack being directly in contact with P—GaN layer, making channel formation in this device very slow. Moreover, due to unavailability of minority carriers (electrons) in P—GaN buffer, formed channel electron density will be very small (can be almost negligible depending of P—GaN doping), which will give rise to ON resistance. Further, as the AlGaN layer is directly above P—GaN buffer, the carrier density in 2DEG is expected to be very less, which will further give rise to ON resistance. Also, high breakdown voltage would require higher P—GaN doping, however this can deplete 2DEG. Furthermore, attributed to very thin N-doped layer above P—GaN buffer (typical AlGaN is 25-40 nm thick), the device of U.S. Pat. No. 7,449,762 B1 will offer significantly lower breakdown voltage when compared to device without P-doped buffer (i.e. with N-doped buffer). In view of such technical problems in the device of U.S. Pat. No. 7,449,762 B1 a person skilled in the art would clearly understand that it would not be an exaggeration to conclude that this prior art device would offer significantly inferior breakdown voltage vs. ON-resistance trade-off, when compared to other prior art devices There is therefore a need to provide a new, improved, efficient, and technically advanced HEMT device that can provide higher breakdown voltage when compared to the designs available in the prior-art without affecting performance figure of merits. Further, new HEMT device should offer improved breakdown voltage as compared to ON-resistance trade-off, improved short channel effects, improved gate control over channel, improved switching speed for a given breakdown voltage, and improved device reliability. Furthermore, the new HEMT device should lower gate-to-drain (miller) capacitance and should be available at low cost.

In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all groups used in the appended claims.

OBJECTS OF THE INVENTION

A general object of the present disclosure is to present a GaN HEMT that offers improved breakdown voltage as compare to ON-resistance trade-off.

Another object of the present disclosure is to present a GaN HEMT that improves the short channel effects and hence gate control over channel.

Another object of the present disclosure is to present a GaN HEMT that increases switching speed for a given breakdown voltage.

Another object of the present disclosure is to present a GaN HEMT that improves device reliability.

Another object of the present disclosure is to present a GaN HEMT that reduces device foot print, hence lowers the cost.

Another object of the present disclosure is to present a GaN HEMT that reduces gate field plate length; hence lowers gate-to-drain (miller) capacitance.

SUMMARY

The present disclosure relates generally to transistors. In particular the present disclosure relates to a high electron mobility transistor having an engineered buffer layer for reduced surface field (RESURF).

In an aspect, the present disclosure discloses a transistor comprising: an n-doped Group III nitride semiconductor buffer layer; a p-doped Group III nitride semiconductor buffer layer; and one or more recessed gates in contact directly with the n-doped Group III nitride semiconductor buffer layer.

In an embodiment, the transistor can be a normally OFF high electron mobility transistor (HEMT). In another embodiment, the n-doped Group III nitride semiconductor and the p-doped Group III nitride semiconductor can be n-doped Gallium Nitride (GaN) and p-doped GaN respectively.

In another aspect, the p-doped Group III nitride semiconducting layer is embedded within the n-doped Group III nitride semiconductor buffer layer. In a further aspect, the p-doped Group III nitride semiconducting layer has one or more contacts that are isolated from the source region. In an alternating embodiment, the p-doped Group III nitride semiconducting layer has one or more contacts that are abutted with the source region.

In another aspect, the n-doped Group III nitride semiconductor buffer layer and the p-doped Group III nitride semiconductor layer together form a reduced surface field (RESURF) around the p-doped Group III nitride semiconductor layer.

In another aspect, the p-doped Group III nitride semiconductor layer extends from source edge, covers the region under the gate and extends partially into the drift region.

In another aspect, the thickness of the n-doped Group III nitride semiconductor buffer layer over the p-doped Group III nitride semiconductor layer is greater than penetration of recessed gate region inside the n-doped Group III nitride semiconductor buffer layer.

In a further aspect, the thickness of the n-doped Group III nitride semiconductor buffer layer over the p-doped Group III nitride semiconductor layer is equal to or less than depletion width under the gate and above p-doped Group III nitride semiconductor layer.

In another aspect, the one or more recessed gates is filled with a dielectric and metal stack. Alternately, the recessed gate is filled with a metal and metal stack.

In an embodiment, gate dielectric can be any or a combination of Silicon Oxynitride (SiON), Gallium Oxide (GaO), Titanium Dioxide (TiO2), Hafnium Oxide (HfO2), Aluminium Oxide (Al2O3) and Silicon Dioxide (SiO2).

In another aspect, a spacer layer can be disposed over the n-doped Group III nitride semiconductor buffer layer. In an embodiment, the spacer layer can be made of Aluminium Nitride (AlN).

In another aspect, a barrier semiconductor layer can be disposed above the spacer layer such that said barrier semiconductor layer has a wider bandgap than said n-doped Group III nitride semiconductor buffer layer. In an embodiment, the barrier layer can be made of any or a combination of Aluminium Gallium Nitride (AlGaN) and AlN.

In another aspect, one or more doped GaN layers can be disposed between the spacer layer and the barrier semiconductor layer.

In an embodiment, the one or more GaN layers can be any or a combination of n-doped GaN layer and p-doped GaN layer. Further, the any or a combination of n-doped GaN layer and p-doped GaN layer can be disposed between at least two intrinsically doped GaN (i-GaN) layers. Alternatively, they can be disposed within an i-GaN layer.

In another aspect, a capping layer can be disposed over the barrier semiconductor layer. In an embodiment, the capping layer can be made of GaN.

In another aspect, a passivation layer can be disposed above the capping layer. In an embodiment, the passivation layer can be made of any or a combination of Silicon Nitride (SiN), SiON, GaO, TiO2, HfO2, Al2O3 and SiO2.

In another aspect, the substrate for the transistor can be made from Silicon (Si), Silicon Carbide (SiC) or Sapphire.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
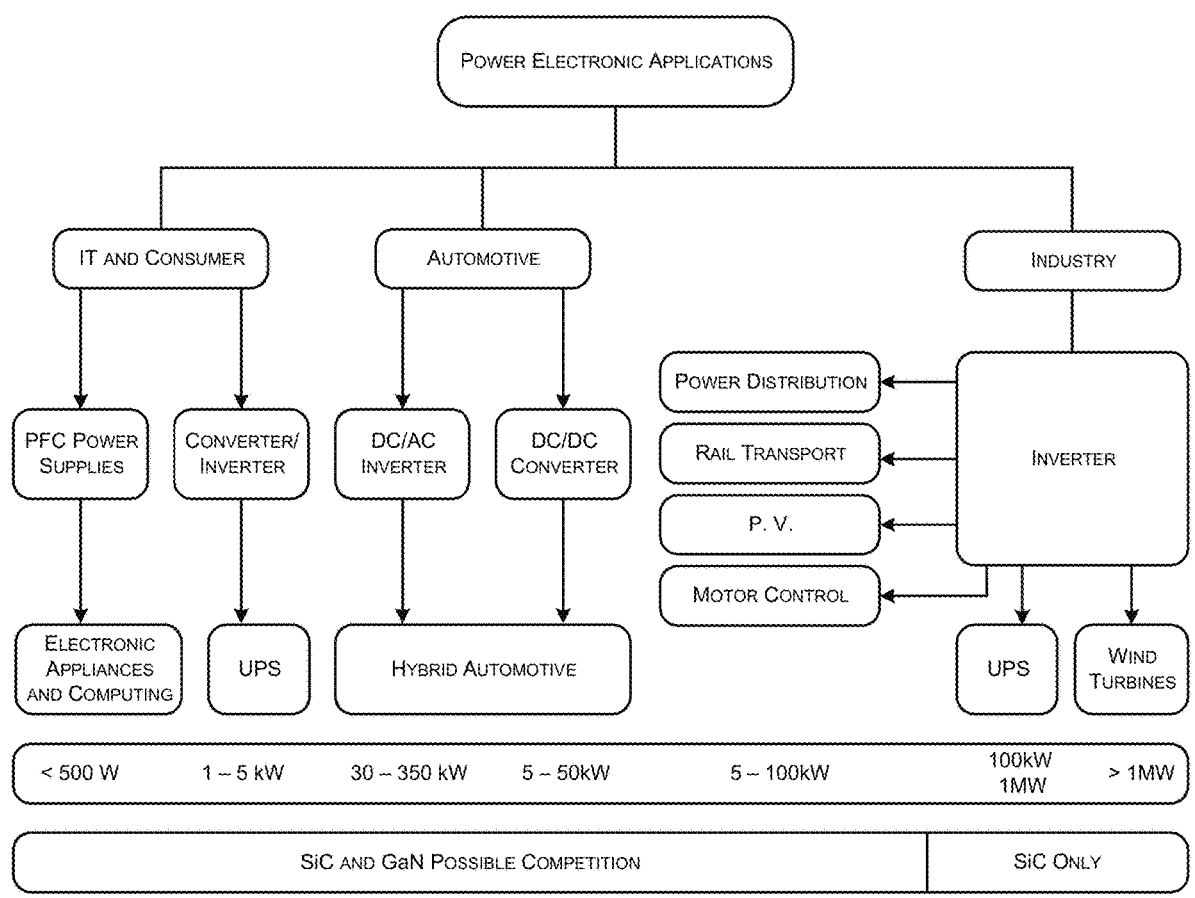
FIG. 1 illustrates a broad view of power electronics spectrum and applications (Prior Art).
Figures 2A, 2B:
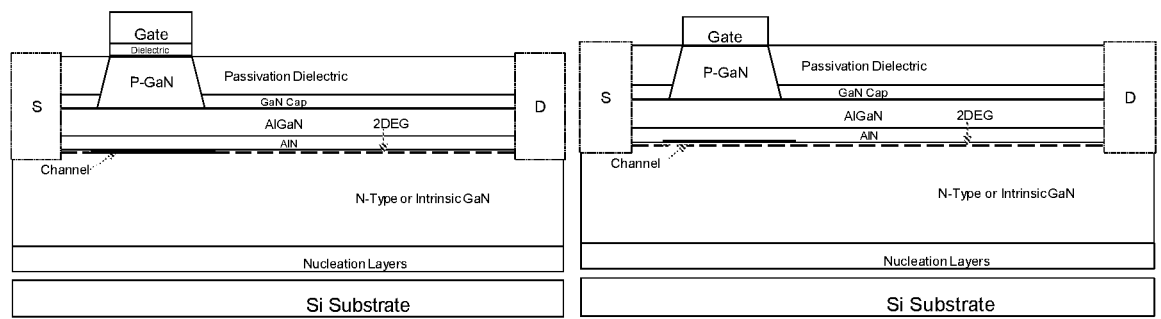
FIGS. 2A-2B illustrate normally-OFF HEMT devices with P—GaN reverse polarization layer under gate electrode as available in the prior-art.
Figure 3:
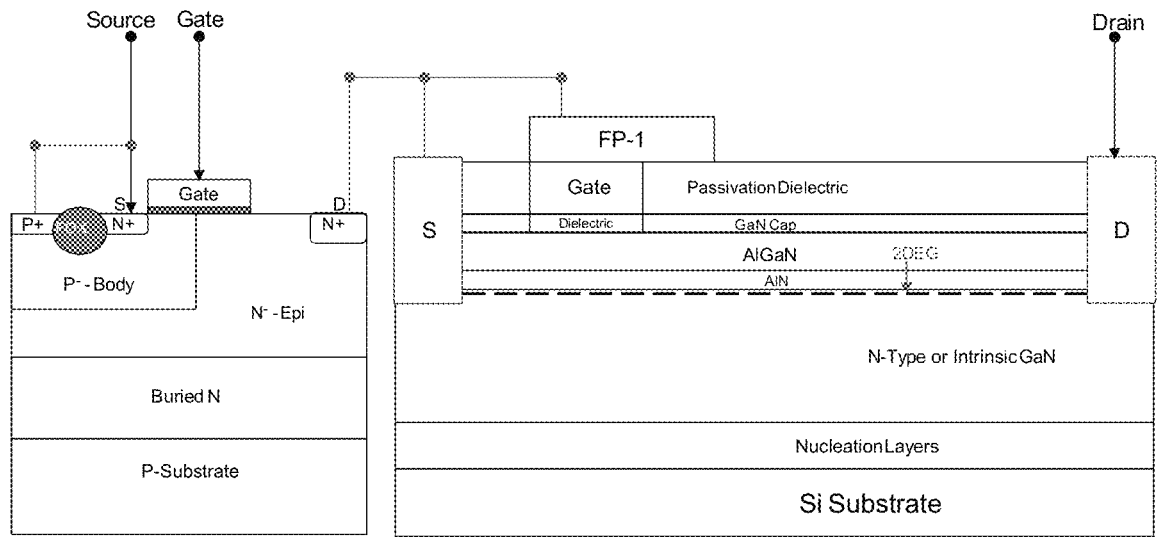
FIG. 3 illustrates normally-OFF HEMT device with Si LDMOS in Cascode configuration with normally-ON HEMT device as available in the prior-art.
Figure 4:
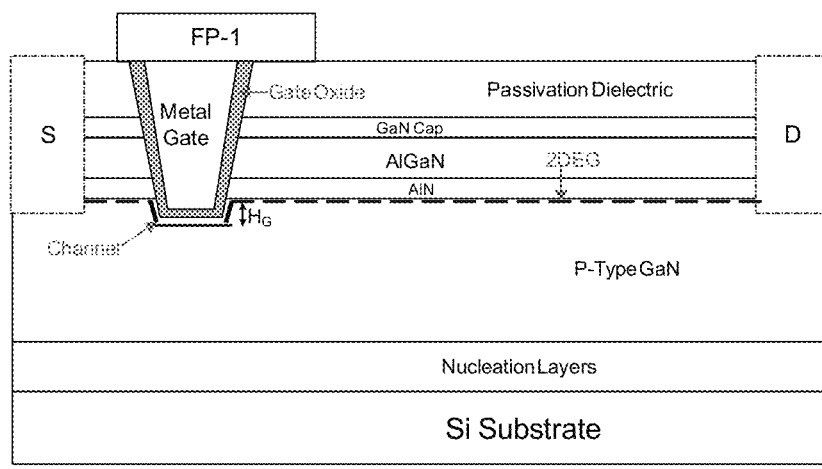
FIG. 4 illustrates normally-OFF HEMT device with recess gate and RESURF layer where the recess gate is in direct contact with P—GaN layer as available in the prior art.

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

Various terms as used herein are shown below. To the extent a term used in a claim is not defined below, it should be given the broadest definition persons in the pertinent art have given that term as reflected in printed publications and issued patents at the time of filing.

The present disclosure relates generally to devices having elements operating with a 2-dimension electron gas (2DEG), and relates in particular to recess gate superjunction (SJ) high-electron-mobility transistor (HEMT) operating with a 2DEG It an object of the present disclosure to solve the technical problems as recited above. Accordingly, in an embodiment, the present disclosure provides a new, improved, efficient and technically advanced HEMT device which can provide higher breakdown voltage when compared to the designs available in the prior-art without affecting the performance figure of merits. Further, the new HEMT device offers improved breakdown voltage as compared to ON-resistance trade-off, improved the short channel effects, improved gate control over channel, improved switching speed for a given breakdown voltage, and improved device reliability. Furthermore, the new HEMT device lowers gate-to-drain (miller) capacitance and is available at low cost. In another embodiment, the present disclosure provides superjunction based design for normally-OFF HEMT, which offers 7 times higher breakdown voltages, when compared to the designs available in the prior-art without affecting the performance figure of merit. Such designs of the new HEMT device for switching applications.

An aspect of the present disclosure provides a GaN High Electron Mobility Transistor (HEMT) that includes N-type or unintentionally N-doped GaN buffer disposed over a transition layer and a substrate and below the barrier layer and channel, P-type or P-doped region embedded inside the GaN buffer, which together with N-type GaN buffer layer forms a superjunction or reduced surface field (RESURF) junction around it, wherein the P-type region extends from source edge, covers the region under the gate and extends partially into the drift region, and recessed gate directly in contact with N-type GaN buffer.

In an aspect, thickness of N-type GaN buffer above P-type layer (HG-P)>>penetration of recessed gate region inside the N-type GaN buffer (HG) and equal to or less than ($\leq$) depletion width under the gate and above P-type layer. In another aspect, penetration of recessed gate region inside the N-type GaN buffer (HG) is less than or equal to ($\leq$) 0.

In an aspect, drift region field is distributed across the superjunction. In another aspect, the peak electric field at the gate edge is lower than the peak electric field around the superjunction. In yet another aspect, recessed gate region can be filled with dielectric and metal stack. In another aspect, the recessed gate region can be filled with metal or metal stack. In yet another aspect, P-type region has a contact that is isolated from the source region. In still another aspect, the P-type region has a contact that is abutted with the source region.

In an aspect, GaN HEMT of the present disclosure can further include an AlN spacer layer that is disposed over N-type GaN buffer, an AlGaN or AlN barrier layer disposed over the AlN spacer layer, a GaN capping layer disposed over the barrier layer, and a SiN passivation layer disposed over the capping layer. In another aspect, the GaN HEMT can further include an AlGaN or AlN barrier layer that is disposed over N-type GaN buffer, and a SiN passivation layer disposed over the barrier layer.

In an aspect, the proposed GaN HEMT can further include a first field plate connected to gate and directed towards drain. In another aspect, the GaN HEMT can further include a second field plate that is connected with source and directed towards drain.

In an aspect, the GaN HEMT can be used in RF as well as power electronic applications.

In an aspect, passivation dielectric can be selected from any or a combination of GaO (Gallium Oxide), HfO2, SiO2, Al2O3, Si3N4, SiON (Silicon oxynitride) or a combination of these. In another aspect, the gate dielectric can be GaO (Gallium Oxide), TiO2, HfO2, SiO2, Al2O3, Si3N4, SiON (Silicon oxynitride) or a combination of these.

In an aspect, nucleation layers can be step graded, linearly graded, or can be of AlN interlayer type. In an aspect, the substrate can be Si, SiC or Sapphire. In another aspect, N-type GaN layer is Carbon doped. In yet another aspect, the AlGaN layer can be N-type doped with uniform or graded or Gaussian doping profile.

An aspect of the present disclosure provides a GaN High Electron Mobility Transistor (HEMT) that can include N-type or unintentionally N-doped GaN buffer that is disposed over a transition layer and a substrate, and positioned below barrier layer and channel, P-type or P-doped region embedded inside the GaN buffer, which together with N-type GaN buffer layer forms a superjunction or reduced surface field (RESURF) junction around it; wherein P-type region extends from source edge, covers the region under the gate and extends partially into the drift region, and a P-type reverse polarization GaN layer between gate metal and GaN Cap or AlGaN barrier.

In an aspect, thickness of N-type GaN buffer can be >500 nm and doping of P-type GaN region can be >1e19 $cm^{-3}$.

Figure 5:
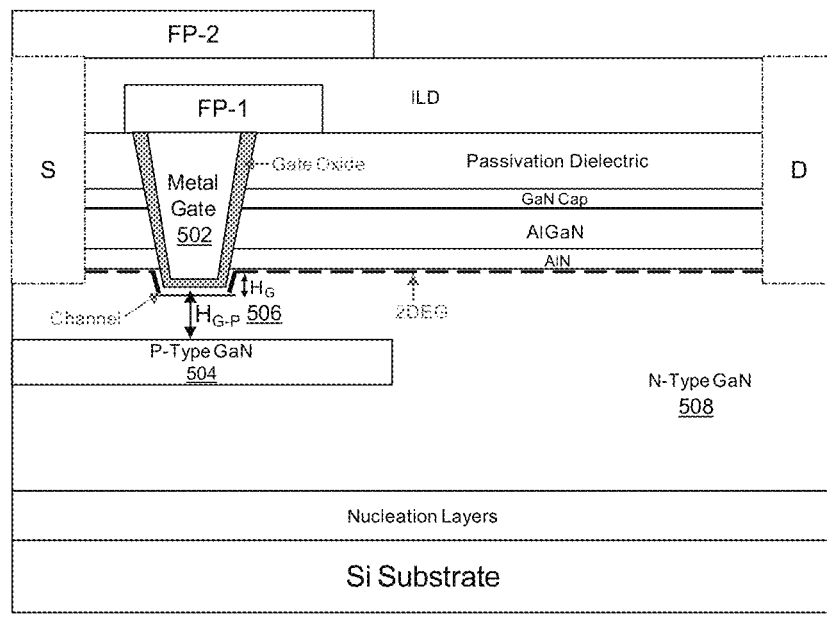
FIG. 5 illustrates a proposed GaN HEMT power device in accordance with an exemplary embodiment of the present disclosure.

FIG. 5 illustrates the proposed GaN HEMT power device in accordance with an exemplary embodiment of the present disclosure. In an embodiment, FIG. 5 shows the proposed GaN HEMT normally-OFF power device with a metal (recess) gate 502, and a P-type buffer 504 that is configured below N-type buffer 508. N-type and P-type buffers together form a RESURF junction, wherein, in an aspect, HG-P can be greater than 0 nm (506). It should be noted that recess gate may never be in contact with P—GaN layer.

In an embodiment, the proposed device includes a recessed high-K metal gate 502 and a superjunction layer 504 under the gate, which is embedded within the N-type GaN buffer layer and separated from the recessed gate 502. Metal (Recess) gate 502 can be configured to deplete 2DEG from channel region (under the gate) when the transistor is under OFF state.

In an embodiment, the proposed device according to the present disclosure can include an optimally doped conduction path between a source region (S) and a drain region (D). The proposed device may include three or more layers including a first layer, (e.g., a substrate and a buffer layer) as shown in Si substrate, a second layer (e.g., a body region) as shown in nucleation layer, and a third layer (e.g., a RESURF layer). A passivating dielectric layer may be formed between the drain region and the source region on the RESURF layer. The dielectric may be, for example, silicon dioxide, silicon nitride, polyimide, deposited silicon carbide (SiC), deposited diamond, or other high-k dielectrics.

As well known in the prior-art, the first layer may be formed using a substrate or a buffer layer or combination thereof having a backside metalized terminal. The metalized terminal may be optionally shorted electrically to the source contact. For example, the substrate may be a mechanical wafer on top of which high quality crystalline Gallium Nitride may be grown using appropriate buffer layers, as is commonly practiced by those skilled in the art of GaN material growth. This region including all combined layers as referred to as layer. Commonly used substrate materials include, for example, Sapphire, Silicon, Silicon Carbide, Gallium Nitride, glass, diamond or other semi-insulating or insulating substrate material that provides a handle wafer with good mechanical and thermal properties to enable a device to be fabricated and have efficient performance. Buffer layers that may be used include, for example, Aluminum Nitride, Aluminum Gallium Nitride, and others as known by those skilled in art of heteroepitaxy growth of GaN. In one implementation, the layer may have a thickness ($t_{substrate}$) of approximately 100-500 μm with a doping of zero to $10^{22}$ cm$^{-3}$. An optional very thin highly doped backside layer (not shown) of the same conductivity type as layer may be ion implanted in the substrate or epitaxially grown thereon having a thickness of 0.01 to 10 μm. The highly doped backside layer may be provided to prevent a vertical electric field from reaching the metallized gate terminal.

The second layer may be formed of a low doped p-type conductivity semiconductor or insulating layer between first layer and third layer. The second layer may be grown (e.g., using a high quality epitaxial process) on layer to a thickness of one to approximately 50 μm with an acceptor doping which may be referred to herein as the body region.

In an exemplary embodiment, the dielectric layer can be formed on the top surfaces and sidewalls of a plurality of fins. Gate electrode can then be formed and may be formed directly over a plurality of fins having fin pitch (FP), say FP-1 and FP-2. Interlayer dielectric (ILD) can formed to cover the proposed device and contact plug can be formed to electrically connect to gate electrode. In an exemplary embodiment, the Fins have minimum fin pitch FP. In an embodiment, minimum fin pitch FP is not equal to, and may be smaller than or greater than, minimum metal pitch MetP. Fin pitch FP1 may be different from fin pitch FP2, although they may be substantially equal to each other, for example, with a difference smaller than five percent of each of fin pitches FP1 and FP2. Fin pitches FP1 and FP2 may also be equal to each other.

In an embodiment, by definition, a transistor can be considered to be in OFF state when gate-to-source voltage is less than threshold voltage or in general is tied to 0 Volts (for normally-OFF device). The proposed device according to the present disclosure, together with recess gate 502 can have a P-N junction around the superjunction layer, wherein the superjunction layer allows distributing space charge across the whole P-N junction, which earlier (device without superjunction i.e., in prior art) was centered at the gate edge (few 100 nm), as depicted in FIG. 6.

Figure 6:
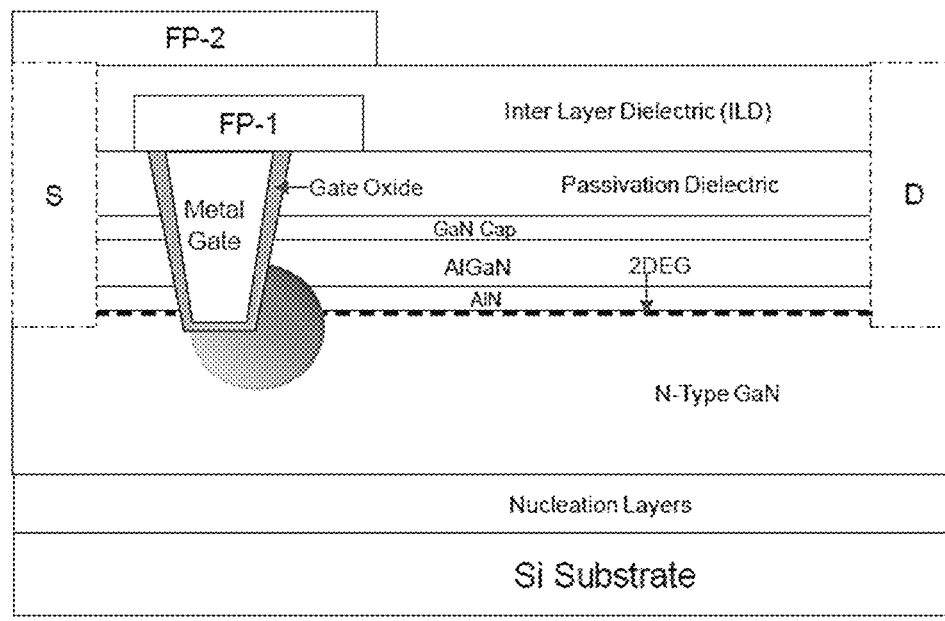
FIG. 6 illustrates representative electric field spot (in dark/highlighted) in the recess gate device as available in the prior-art.
Figure 7A:
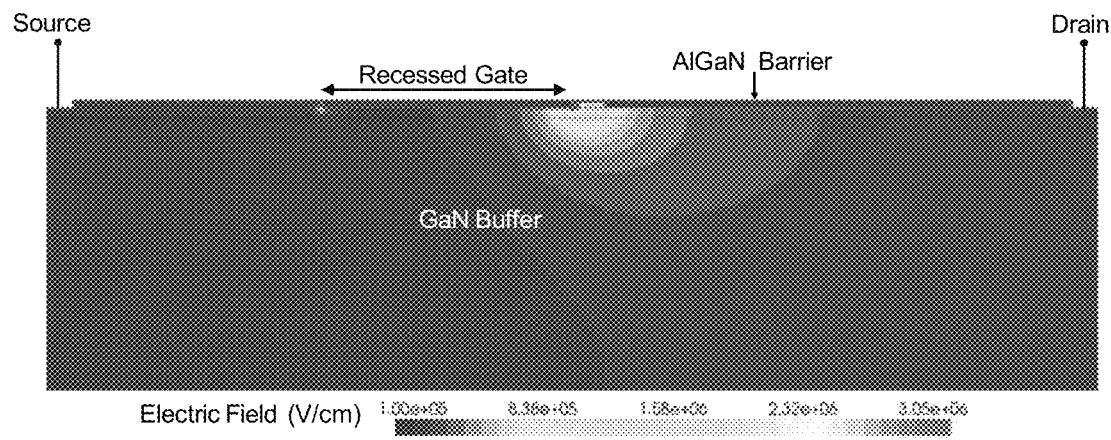
FIG. 7A illustrates a simulated OFF state electric field profile in the recess gate device as available in the prior-art extracted using device TCAD simulations at fixed drain bias.
Figure 7B:
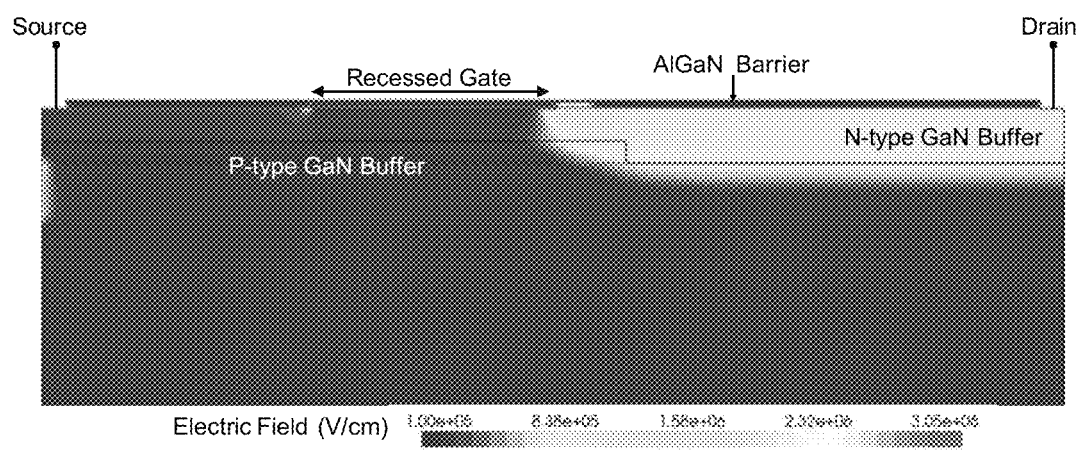
FIG. 7B illustrates a simulated OFF state electric field profile in proposed recess gate superjunction HEMT, extracted using device TCAD simulations at fixed drain bias, in accordance with an exemplary embodiment of the present disclosure.
Figure 8:
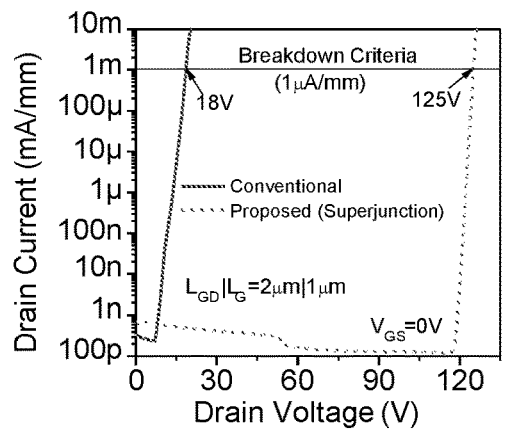
FIG. 8 illustrates simulated OFF state three terminal breakdown characteristics of the recess gate device as available in the prior-art and proposed recess gate superjunction HEMT in accordance with an exemplary embodiment of the present disclosure.

FIG. 6 illustrates representative electric field spot (in dark/highlighted) in the recess gate device as available in the prior-art. FIG. 7A illustrates a simulated OFF state electric field profile in the recess gate device as available in the prior-art extracted using device TCAD simulations at fixed drain bias. Spreading space change across the whole P-N junction area according to the present disclosure, which could be in few μm in length, significantly relaxes the space charge density and therefore lowers the electric field for a given applied drain voltage as shown in FIG. 7B. FIG. 7B illustrates a simulated OFF state electric field profile in proposed recess gate superjunction HEMT, extracted using device TCAD simulations at fixed drain bias, in accordance with an exemplary embodiment of the present disclosure. The lowering of peak electric field allows further increase in drain voltage without avalanche breakdown and therefore improves breakdown voltage without increasing ON-resistance and other performance metrics (FIGS. 8-10). Furthermore, shifting the hot spot away from gate edge improves hot carrier and gate oxide reliability. It is also worth highlighting that shifting the peak electric field away from gate edge minimizes the requirement of field plate and hence lowers miller capacitance, which in-turn improves switching performance as well as cut-off frequency of the device.

FIG. 8 illustrates a graph showing simulated OFF state three terminal breakdown characteristics of the recess gate device available in the prior-art as compared to simulated OFF state three terminal breakdown characteristics of the proposed recess gate superjunction HEMT. It is clear from the FIG. 8 that the proposed device offers approximately 7 times higher breakdown voltage for the same design parameters.

Figure 9A:
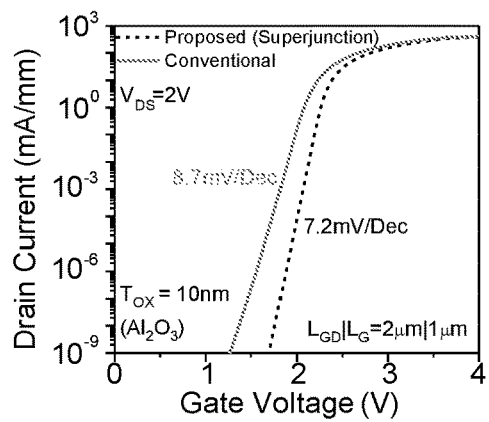
FIG. 9A illustrates a graph of a simulated drain current as compared to gate voltage characteristics of the recess gate device as available in the prior-art and the proposed recess gate superjunction HEMT in accordance with an exemplary embodiment of the present disclosure.
Figure 9B:
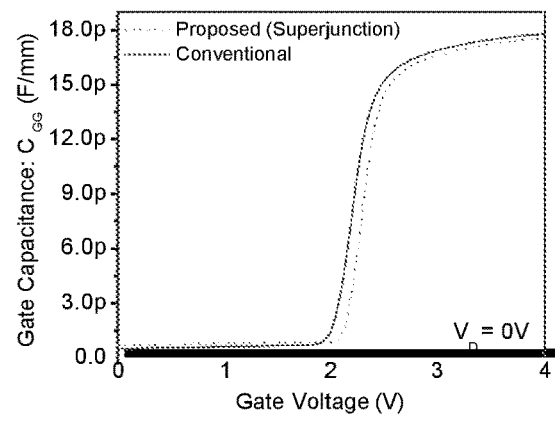
FIG. 9B illustrates a graph of a simulated gate capacitance as compared to gate voltage characteristics of the recess gate device as available in the prior-art and proposed recess gate superjunction HEMT in accordance with an exemplary embodiment of the present disclosure.
Figure 10:
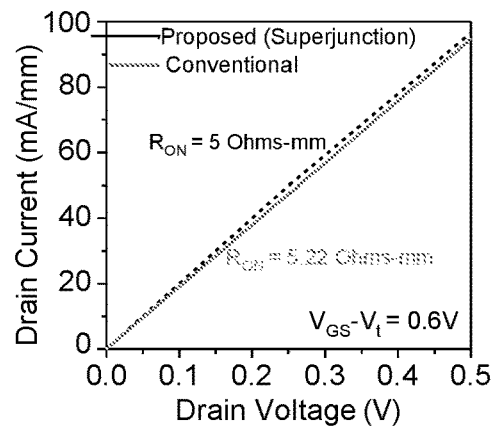
FIG. 10 illustrates a graph of a simulated drain current as compared to drain voltage characteristics, depicting the linear region of the recess gate device as available in the prior-art and proposed recess gate superjunction HEMT in accordance with an exemplary embodiment of the present disclosure.

FIG. 9A illustrates a graph showing simulated drain current as compared to gate voltage characteristics of the recess gate device available in the prior-art as compared to simulated drain current as compared to gate voltage characteristics of the proposed recess gate superjunction HEMT in accordance with an exemplary embodiment of the present disclosure. FIG. 9B illustrates a graph showing simulated gate capacitance as compared to gate voltage characteristics of the recess gate device available in the prior-art as compared to proposed recess gate superjunction HEMT in accordance with an exemplary embodiment of the present disclosure.

FIG. 10 illustrates a graph of a simulated drain current as compared to drain voltage characteristics, depicting the linear region of the recess gate device as available in the prior-art and proposed recess gate superjunction HEMT in accordance with an exemplary embodiment of the present disclosure. It is clear from FIG. 10 that the proposed device offers better performance (4.25% less I.R drop) figure of merit as compared to device available in the prior-art.

Figure 11:
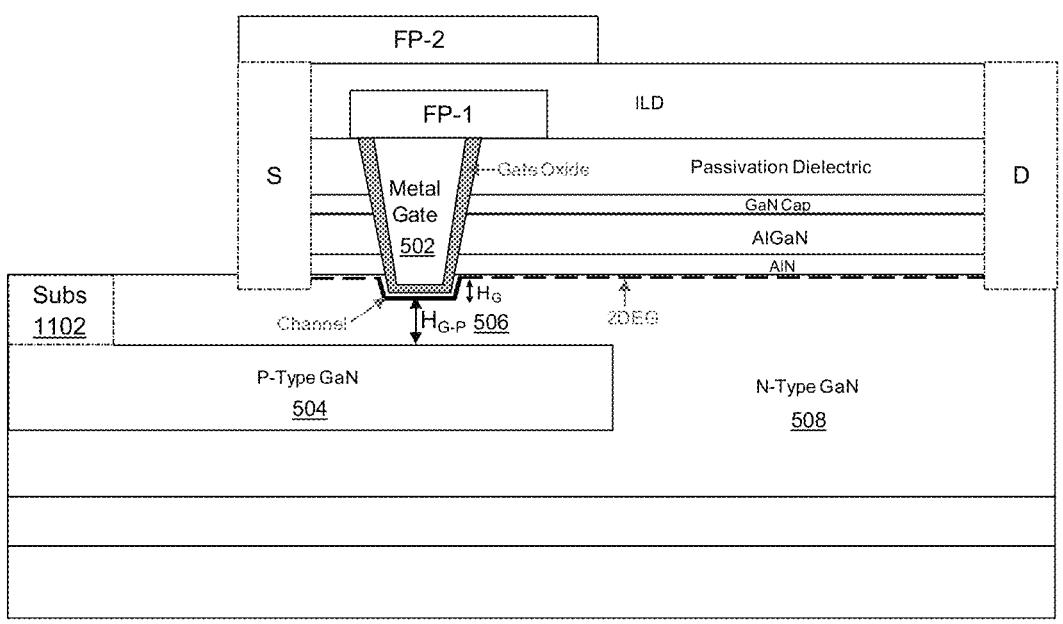
FIG. 11 illustrates a proposed recess gate superjunction HEMT with substrate contact in accordance with an exemplary embodiment of the present disclosure.

FIG. 11 illustrates a proposed recess gate superjunction HEMT with substrate contact 1102 in accordance with an exemplary embodiment of the present disclosure. In an embodiment, the substrate contacts 1102 offers a fixed potential to the P—GaN layer 504, which allows fields to increase and continue to spread across the P—N GaN junction when drain voltage is lifted up. In an aspect, a device without substrate contact may limit the field distribution/spread across the RESURF junction beyond a drain voltage, as beyond a certain drain voltage (depending on P—GaN doping), the P—GaN layer will start following drain voltage and hence limit the maximum field across the superjunction region. In this case, P—N junction around superjunction layer will initially help in suppressing peak electric field; however, for lower P—GaN doping the breakdown would be limited close to gate edge.

Figure 12:
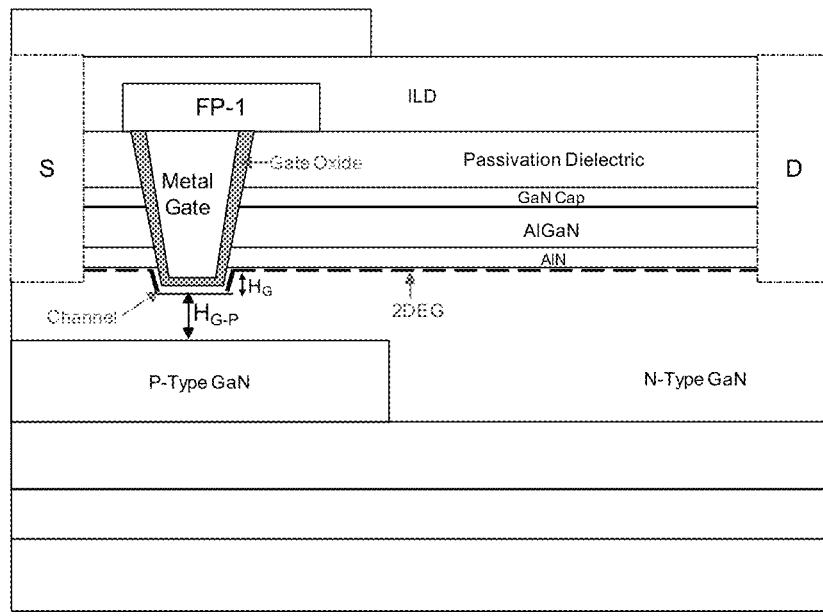
FIG. 12 illustrates a proposed GaN HEMT normally-OFF power device with recess gate, P-type buffer below N-type buffer where N-type GaN buffer has a P-type implanted superjunction region in accordance with an exemplary embodiment of the present disclosure.
Figure 13:
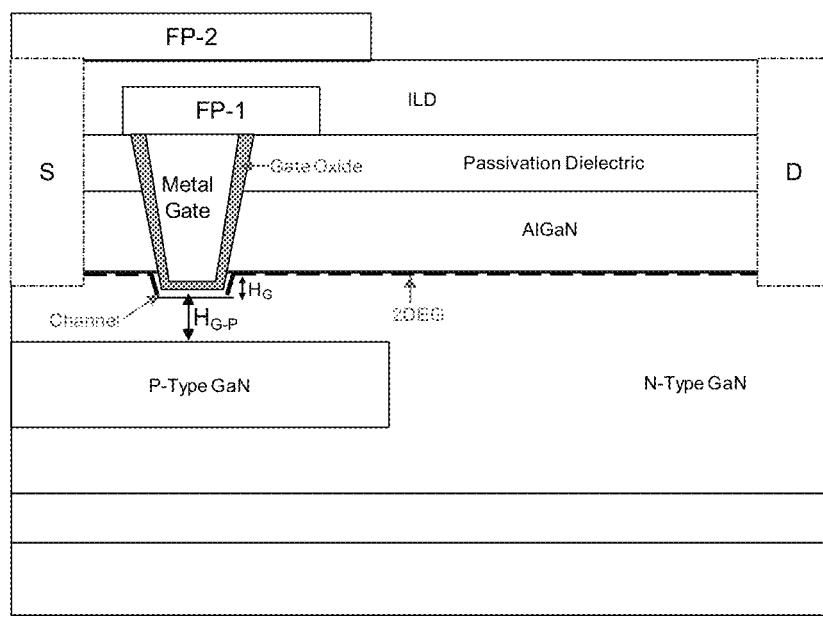
FIG. 13 illustrates a proposed recess gate superjunction HEMT without AlN layer and GaN cap in accordance with an exemplary embodiment of the present disclosure.
Figure 14:
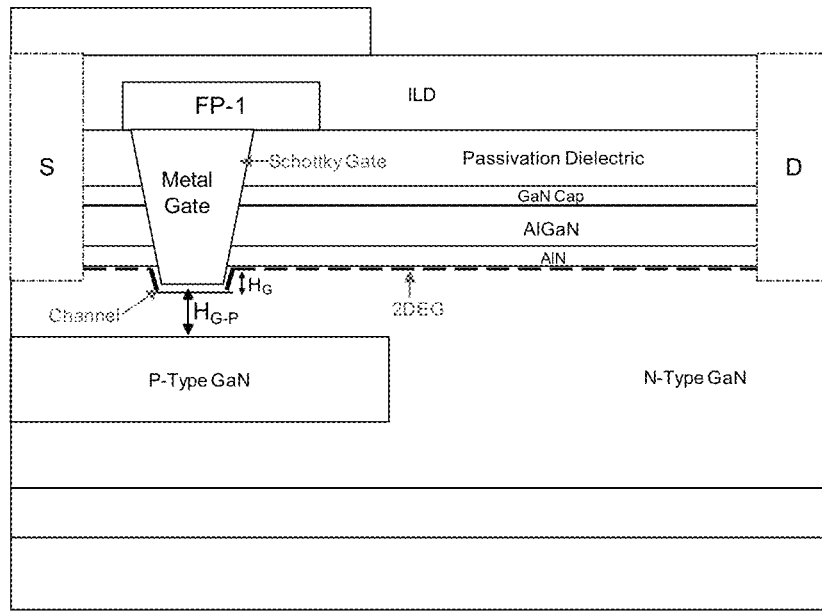
FIG. 14 illustrates a proposed recess gate superjunction HEMT with Schottky gate in accordance with an exemplary embodiment of the present disclosure.

FIG. 12 illustrates proposed GaN HEMT normally-OFF power device with recess gate, P-type buffer below N-type buffer where N-type GaN buffer has a P-type implanted superjunction region in accordance with an exemplary embodiment of the present disclosure. FIG. 13 illustrates a proposed recess gate superjunction HEMT without AlN layer and GaN cap in accordance with an exemplary embodiment of the present disclosure. FIG. 14 illustrates a proposed recess gate superjunction HEMT with Schottky gate in accordance with an exemplary embodiment of the present disclosure.

Figure 15:
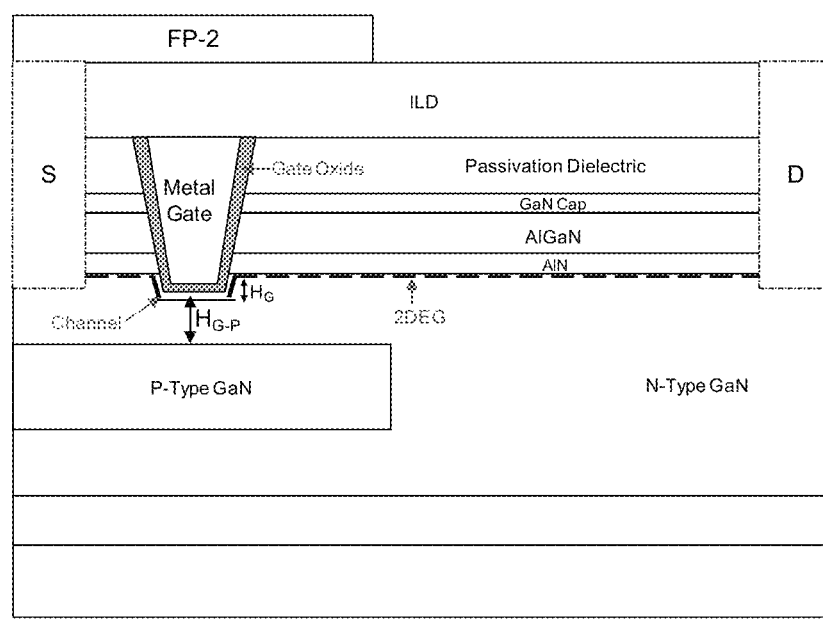
FIG. 15 illustrates a proposed recess gate superjunction HEMT without gate field plate in accordance with an exemplary embodiment of the present disclosure.

FIG. 15 illustrates a proposed recess gate superjunction HEMT without gate field plate in accordance with an exemplary embodiment of the present disclosure. In an embodiment, if the impact ionization or the avalanche breakdown is centered on superjunction region, which can be far away from the gate edge, the field plate(s) wouldn't be required.

Figure 16:
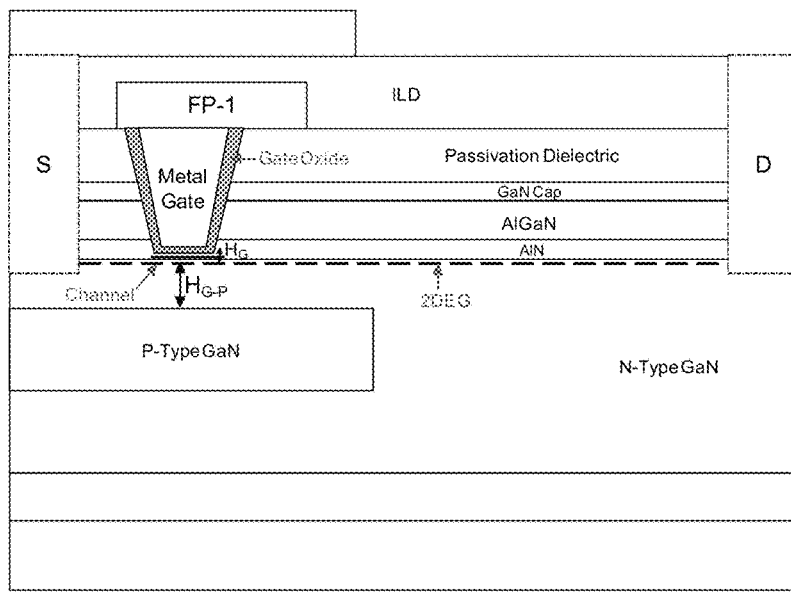
FIG. 16 illustrates a proposed recess gate superjunction HEMT where HG≤0 nm in accordance with an exemplary embodiment of the present disclosure.

FIG. 16 illustrates a proposed recess gate superjunction HEMT where HG≤0 nm in accordance with an exemplary embodiment of the present disclosure. In an embodiment, this is the case assuming removal of AlN layer wouldn't require for depleting 2DEG under the channel.

Figure 17A:
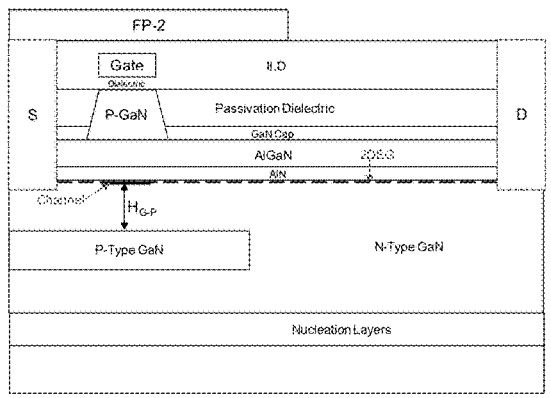
FIGS. 17A-17B illustrates a proposed recess gate superjunction HEMT with P—GaN gate in accordance with an exemplary embodiment of the present disclosure.
Figure 17B:
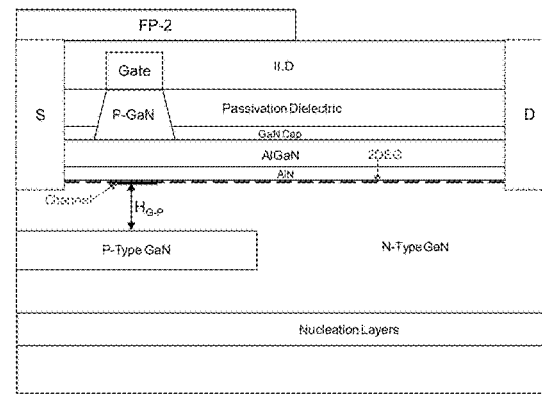

FIGS. 17A-17B illustrates a proposed recess gate superjunction HEMT with P—GaN gate in accordance with an exemplary embodiment of the present disclosure. FIGS. 17A-17B illustrates that instead of recess gate, a P—GaN inverse polarization layer is used to deplete the channel from 2DEG.

Figure 18:
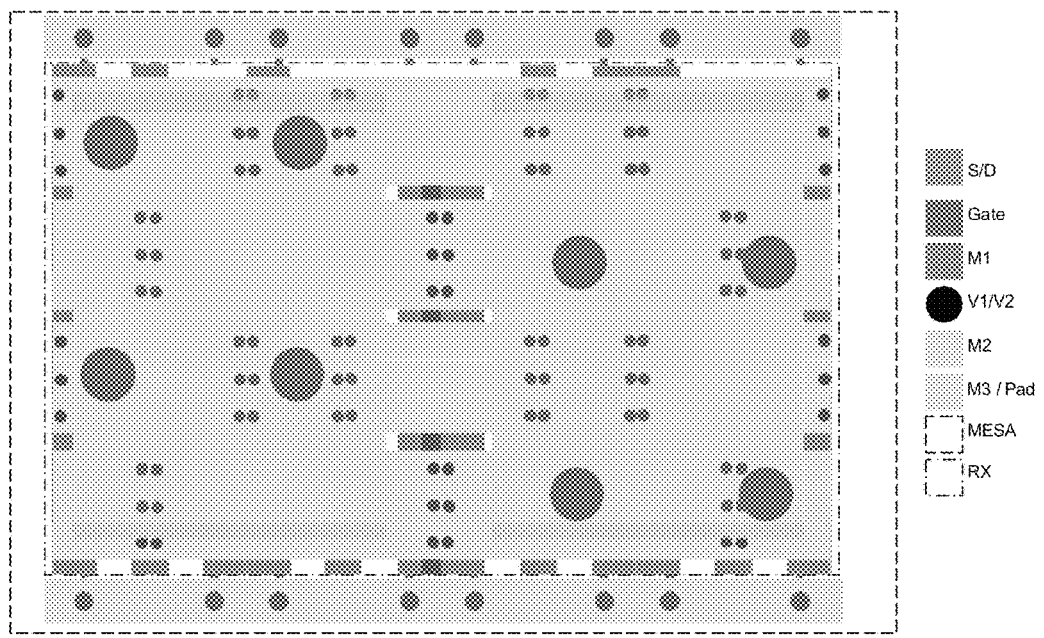
FIG. 18 illustrates an exemplary layout view of proposed recess gate superjunction HEMT with P—GaN gate in accordance with an exemplary embodiment of the present disclosure.

FIG. 18 illustrates an exemplary layout view of proposed recess gate superjunction HEMT with P—GaN gate in accordance with an exemplary embodiment of the present disclosure.

Figure 19A:
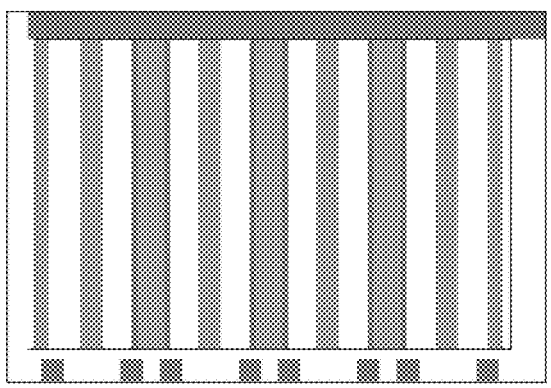
FIG. 19A illustrates a layout view of a design fabricated using a back end of line (BEOL) process till gate mask stage.

FIG. 19A illustrates a layout view of a design fabricated using a back end of line (BEOL) process till gate mask stage.

Figure 19B:
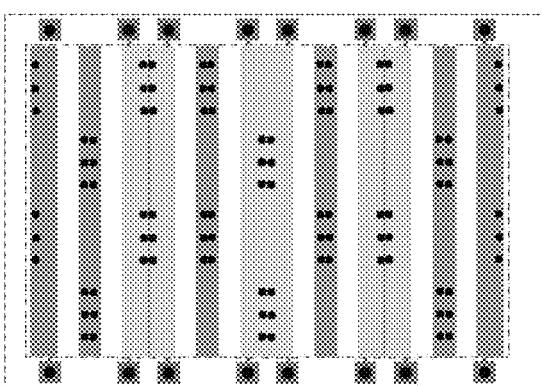
FIG. 19B illustrates a layout view of a design fabricated using a back end of line (BEOL) process till metal-1 via gate mask stage.

FIG. 19B illustrates a layout view of a design fabricated using a back end of line (BEOL) process till metal-1 via gate mask stage.

Figure 19C:
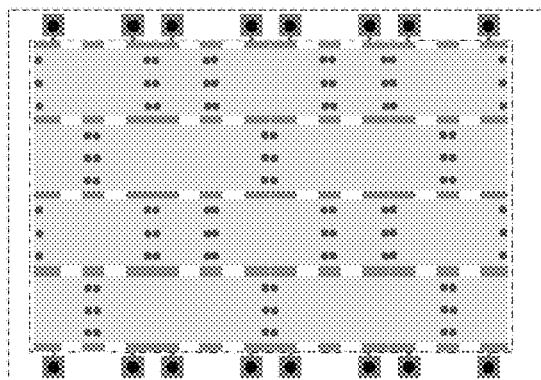
FIG. 19C illustrates a layout view of a design fabricated using a back end of line (BEOL) process till metal-2 via metal-1 and gate mask stage.

FIG. 19C illustrates a layout view of a design fabricated using a back end of line (BEOL) process till metal-2 via metal-1 and gate mask stage.

Figure 19D:
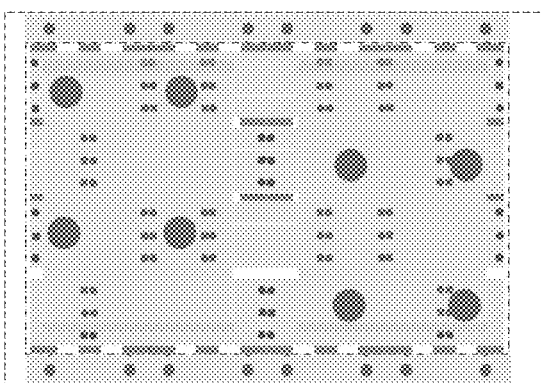
FIG. 19D illustrates a layout view of a design fabricated using a back end of line (BEOL) process till Metal-3 or bond-pad stage.

FIG. 19D illustrates a layout view of a design fabricated using a back end of line (BEOL) process till Metal-3 or bond-pad stage.

In another embodiment, the architecture of the barrier semiconductor layer can also affect the current-voltage characteristics of the HEMT.

Figure 20A:
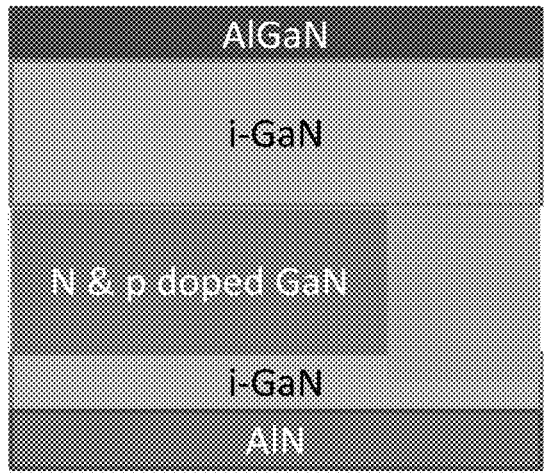
FIGS. 20A-20C illustrate different configurations of the barrier layer, in accordance with an embodiment of the present disclosure.

FIG. 20A illustrates an exemplary architecture of the barrier semiconductor layer, where an n and p doped GaN layer is disposed within an intrinsic GaN (i-GaN) layer. The i-GaN layer is, in turn disposed between the AlN spacer layer and the AlGaN layer.

Figure 20B:
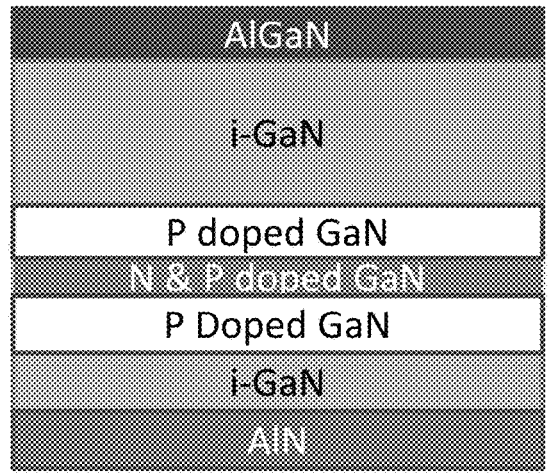

FIG. 20B illustrates an exemplary architecture of the barrier semiconductor layer, where an n and p doped GaN layer is disposed between p-doped GaN layers. The layers of n and p doped Gan sandwiched between two p doped GaN is, in turn sandwiched between two i-GaN layers. This combination of layers is, in turn disposed between the AlN spacer layer and the AlGaN layer.

Figure 20C:
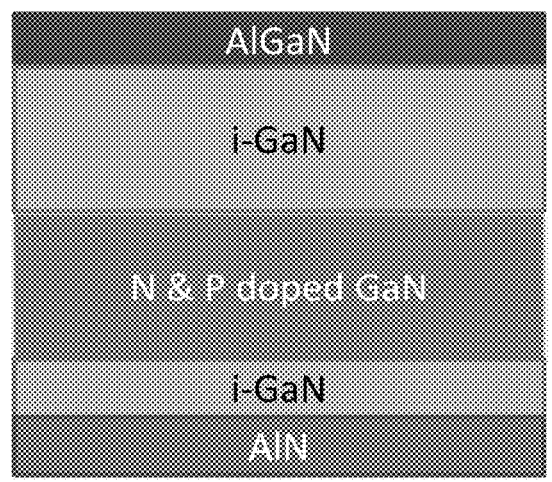

FIG. 20C illustrates an exemplary architecture of the barrier semiconductor layer, where an n and p doped GaN layer is disposed between two i-GaN layers. The i-GaN layer is, in turn disposed between the AlN spacer layer and the AlGaN layer.

Figure 21:
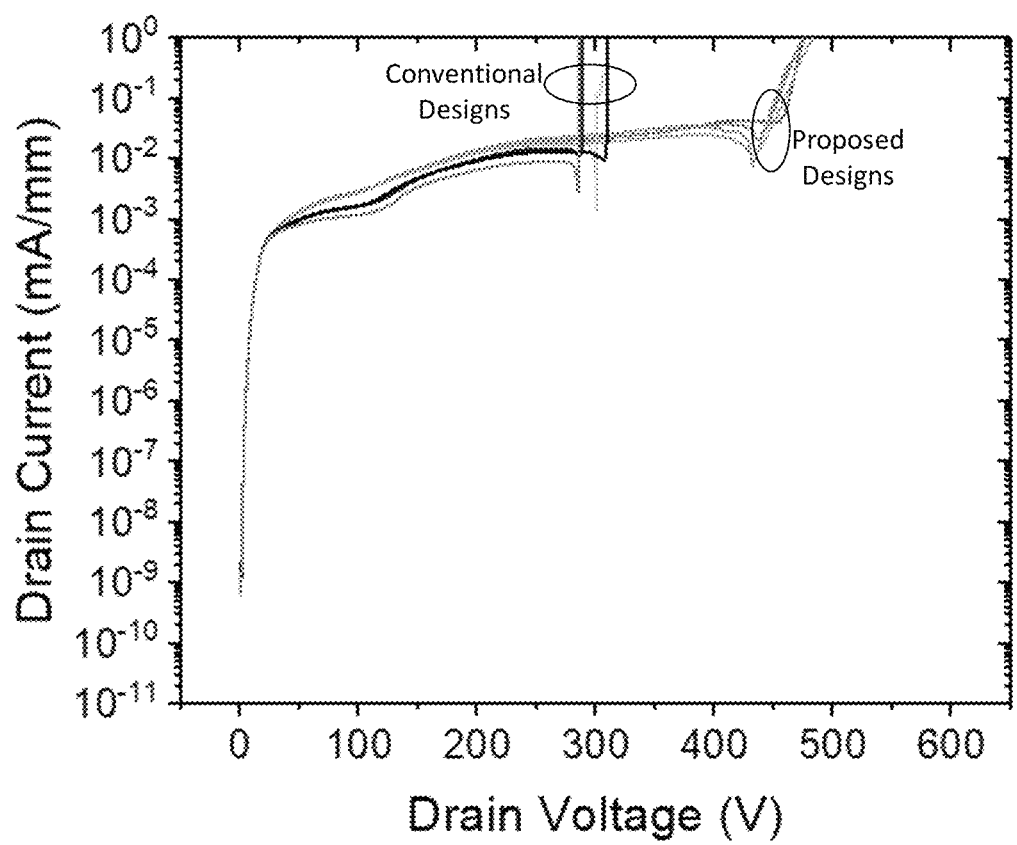
FIG. 21 illustrates an exemplary plot of drain current-voltage characteristics showing improved breakdown characteristics.

FIG. 21 illustrates an exemplary current-voltage characteristic of the HEMT of the present disclosure. The plot reveals the improved breakdown characteristics of the HEMT.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides a GaN HEMT that offers improved breakdown voltage as compare to ON-resistance trade-off.

The present disclosure provides a GaN HEMT that improves the short channel effects and hence gate control over channel.

The present disclosure provides a GaN HEMT that increases switching speed for a given breakdown voltage.

The present disclosure provides a GaN HEMT that improves device reliability.

The present disclosure provides a GaN HEMT that reduces device foot print, hence lowers the cost.

The present disclosure provides a GaN HEMT that reduces gate field plate length; hence lowers gate-to-drain (miller) capacitance.

We claim:

1. A transistor comprising: an n-doped Group III nitride semiconductor buffer layer; a p-doped Group III nitride semiconductor layer wherein said p-doped Group III nitride semiconducting layer is embedded within the n-doped Group III nitride semiconductor buffer layer such that the p-doped Group III nitride semiconducting layer has one or more contacts that are isolated from a source region or are abutted with the source region; and one or more recessed gates in contact directly with the n-doped Group III nitride semiconductor buffer layer; wherein the n-doped Group III nitride semiconductor buffer layer and the p-doped Group III nitride semiconductor layer form a reduced surface field (RESURF) around said p-doped Group III nitride semiconductor layer.

2. The transistor as claimed in claim 1, wherein said transistor is a high electron mobility transistor (HEMT).

3. The transistor as claimed in claim 1, wherein the n-doped Group III nitride semiconductor is n-doped Gallium Nitride (GaN).

4. The transistor as claimed in claim 1, wherein the p-doped Group III nitride semiconductor is p-doped GaN.

5. The transistor as claimed in claim 1, wherein said p-doped Group III nitride semiconductor layer extends from source edge, covers the region under the one or more recessed gates and extends partially into a drift region.

6. The transistor as claimed in claim 1, wherein the thickness of the n-doped Group III nitride semiconductor buffer layer over the p-doped Group III nitride semiconductor layer is greater than penetration of the one or more recessed gates inside the n-doped Group III nitride semiconductor buffer layer.

7. The transistor as claimed in claim 6, wherein the thickness of the n-doped Group III nitride semiconductor buffer layer over the p-doped Group III nitride semiconductor layer is equal to or less than depletion width under one or more recessed gates and above p-doped Group III nitride semiconductor layer.

8. The transistor as claimed in claim 1, wherein the one or more recessed gates is filled with a dielectric and metal stack or with a metal and metal stack.

9. The transistor as claimed in claim 8, wherein the gate dielectric is any or a combination of Silicon Oxynitride (SiON), Gallium Oxide (GaO), Titanium Dioxide ($TiO_2$), Hafnium Oxide ($HfO_2$), Aluminium Oxide ($Al_2O_3$) and Silicon Dioxide ($SiO_2$).

10. The transistor as claimed in claim 1, wherein a spacer layer is disposed over the n-doped Group III nitride semiconductor buffer layer.

11. The transistor as claimed in claim 10, wherein said spacer layer is made of Aluminium Nitride (AlN).

12. The transistor as claimed in claim 10, wherein a barrier semiconductor layer is disposed above the spacer layer such that said barrier semiconductor layer has a wider bandgap than said n-doped Group III nitride semiconductor buffer layer.

13. The transistor as claimed in claim 12, wherein said barrier semiconductor layer is made of any or a combination of Aluminium Gallium Nitride (AlGaN) and AlN.

14. The transistor as claimed in claim 12, wherein on or more doped GaN layers are disposed between the spacer layer and the barrier semiconductor layer.

15. The transistor as claimed in claim 14, wherein the one or more doped GaN layers consist of any or a combination of n-doped GaN layers and p-doped GaN layers disposed between at least two intrinsically doped GaN (i-GaN) layers or disposed within an i-GaN layer.

16. The transistor as claimed in claim 12, wherein a capping layer made of GaN is disposed over the barrier semiconductor layer.

17. The transistor as claimed in claim 16, wherein a passivation layer is disposed over the capping layer, said passivation layer made of any or a combination of Silicon Nitride (SiN), SiON, GaO, $TiO_2$, $HfO_2$, $Al_2O_3$ and $SiO_2$.

18. The transistor as claimed in claim 1, wherein said transistor has a substrate made of Silicon (Si), Silicon Carbide (SiC) or Sapphire.

* * * * *